US 6,433,917 B1

(12) United States Patent
Mei et al.

(10) Patent No.: US 6,433,917 B1
(45) Date of Patent: Aug. 13, 2002

(54) LIGHT MODULATION DEVICE AND SYSTEM

(75) Inventors: Wenhui Mei; Kin Foong Chan, both of Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/718,619

(22) Filed: Nov. 22, 2000

(51) Int. Cl.[7] .............................................. G02B 26/08
(52) U.S. Cl. ........................................ 359/292; 359/291
(58) Field of Search ................................. 359/291, 292, 359/295, 298, 290, 850, 851; 385/120; 345/84, 107

(56) References Cited

U.S. PATENT DOCUMENTS

| | | | |
|---|---|---|---|
| 3,534,467 A | 10/1970 | B. Sachs et al. | 438/48 |
| 4,126,812 A | 11/1978 | Wakefield | 313/500 |
| 4,774,047 A | 5/1988 | Okamoto et al. | 264/513 |
| 4,879,466 A | 11/1989 | Kitaguchi et al. | 250/370.1 |
| 5,049,901 A | 9/1991 | Gelbart | 347/239 |
| 5,079,544 A | 1/1992 | DeMond et al. | 345/84 |
| 5,082,755 A | 1/1992 | Liu | 430/5 |
| 5,106,455 A | 4/1992 | Jacobsen et al. | 216/48 |
| 5,109,290 A | 4/1992 | Imai | 349/2 |
| 5,121,983 A | 6/1992 | Lee | 353/8 |

(List continued on next page.)

FOREIGN PATENT DOCUMENTS

| | | |
|---|---|---|
| EP | EP 0552953 | 7/1993 |
| WO | PCT 9110170 | 7/1991 |

OTHER PUBLICATIONS

"New Multi–EB Direct Write Concept for Maskless High Throughput", Canon SubMicron Focus, vol. 5, Summer 2000.
Sandstrom and Odselius, "Large–Area High Quality Photomasks", Micronic Laser Systems, published by SPIE, vol. 2621, 1985, pp. 312–318.
Singh–Gasson, Sangeet et al., Maskless Fabrication of Light–Directed Oligonucleotide Microarrays Using a Digital Micromirror Array, vol. 17, No. 10, Oct. 1999, pp. 974–978.
Devitt, Terry, "Advanced May Put Gene Chip Technology on Scientists Desktops", http://www.biotech.wise.edu/Education/biotechnews/GeneChip.html, Oct. 7, 1999.

*Primary Examiner*—Ricky Mack
*Assistant Examiner*—Omar Hindi
(74) *Attorney, Agent, or Firm*—Haynes and Boone, LLP

(57) ABSTRACT

A light modulation element, device, and system is discussed. The light modulation element includes three electrodes, a flexible member, and a mirror. The flexible member is connected between the three electrodes so that the first and second electrodes are on one side and the third electrode is on the opposite side of the flexible member. The mirror is attached to the flexible member so that it can move therewith. The flexible member moves responsive to an external electrostatic force provided by one or more of the three electrodes so that the mirror is positioned in a predetermined position responsive to the state of the flexible member.

42 Claims, 8 Drawing Sheets

U.S. PATENT DOCUMENTS

| | | | |
|---|---|---|---|
| 5,131,976 A | 7/1992 | Hoko | 216/3 |
| 5,132,723 A | 7/1992 | Gelbart | 355/40 |
| 5,138,368 A | 8/1992 | Kahn et al. | 355/53 |
| 5,208,818 A | 5/1993 | Gelbart et al. | 372/30 |
| 5,212,588 A | 5/1993 | Viswanathan et al. | 359/355 |
| 5,269,882 A | 12/1993 | Jacobsen | 438/151 |
| 5,281,996 A | 1/1994 | Bruning et al. | 355/77 |
| 5,300,966 A | 4/1994 | Uehira et al. | 353/30 |
| 5,361,272 A | 11/1994 | Gorelik | 372/50 |
| 5,416,729 A | 5/1995 | Leon et al. | 364/578 |
| 5,431,127 A | 7/1995 | Stevens et al. | 117/75 |
| 5,444,566 A * | 8/1995 | Gale et al. | 359/291 |
| 5,461,455 A | 10/1995 | Coteus et al. | 355/43 |
| 5,640,479 A * | 6/1997 | Hegg et al. | 385/120 |
| 5,650,881 A * | 7/1997 | Hornbeck | 359/871 |
| 5,691,541 A | 11/1997 | Ceglio et al. | 250/492.1 |
| 5,771,116 A * | 6/1998 | Miller et al. | 359/295 |
| 5,793,473 A | 8/1998 | Koyama et al. | 355/55 |
| 5,801,813 A | 9/1998 | Morimoto et al. | 355/27 |
| 5,812,242 A | 9/1998 | Tokuda | 355/30 |
| 5,818,498 A | 10/1998 | Richardson et al. | 347/237 |
| 5,866,281 A | 2/1999 | Guckel et al. | 430/22 |
| 5,870,176 A | 2/1999 | Sweatt et al. | 355/53 |
| 5,877,843 A | 3/1999 | Takagi et al. | 355/30 |
| 5,879,843 A | 3/1999 | Ueno | 430/22 |
| 5,892,231 A | 4/1999 | Baylor et al. | 250/398 |
| 5,900,637 A | 5/1999 | Smith | 250/492.22 |
| 5,905,545 A | 5/1999 | Poradish et al. | 348/743 |
| 5,909,658 A | 6/1999 | Clarke et al. | 702/126 |
| 5,936,760 A * | 8/1999 | Choi et al. | 359/298 |
| 5,949,557 A | 9/1999 | Powell | 359/8 |
| 5,955,776 A | 9/1999 | Ishikawa | 257/618 |
| 5,956,005 A * | 9/1999 | Sheridon | 345/84 |
| 5,986,795 A | 11/1999 | Chapman et al. | 359/224 |
| 5,995,129 A | 11/1999 | Sunagawa et al. | 347/239 |
| 5,995,475 A | 11/1999 | Gelbart | 369/112.2 |
| 5,998,069 A | 12/1999 | Cutter et al. | 430/5 |
| 6,007,963 A | 12/1999 | Felter et al. | 430/271.1 |
| 6,014,203 A | 1/2000 | Ohkawa | 355/68 |
| 6,031,598 A | 2/2000 | Tichenor et al. | 355/67 |
| 6,033,079 A | 3/2000 | Hudyma | 359/857 |
| 6,042,976 A | 3/2000 | Chiang et al. | 430/22 |
| 6,048,011 A | 4/2000 | Fruhling et al. | 294/64.3 |
| 6,052,517 A | 4/2000 | Matsunga et al. | 716/8 |
| 6,061,118 A | 5/2000 | Takeda | 355/47 |
| 6,071,315 A | 6/2000 | Ramamurthi et al. | 716/19 |
| 6,072,518 A | 6/2000 | Gelbart | 347/239 |
| 6,084,656 A | 7/2000 | Choi et al. | 355/71 |
| 6,107,011 A | 8/2000 | Gelbart | 430/397 |
| 6,110,607 A | 8/2000 | Montcalm et al. | 428/641 |
| 6,124,876 A | 9/2000 | Sunagawa | 347/239 |
| 6,133,986 A | 10/2000 | Johnson | 355/67 |
| 6,142,641 A | 11/2000 | Cohen et al. | 359/859 |

* cited by examiner

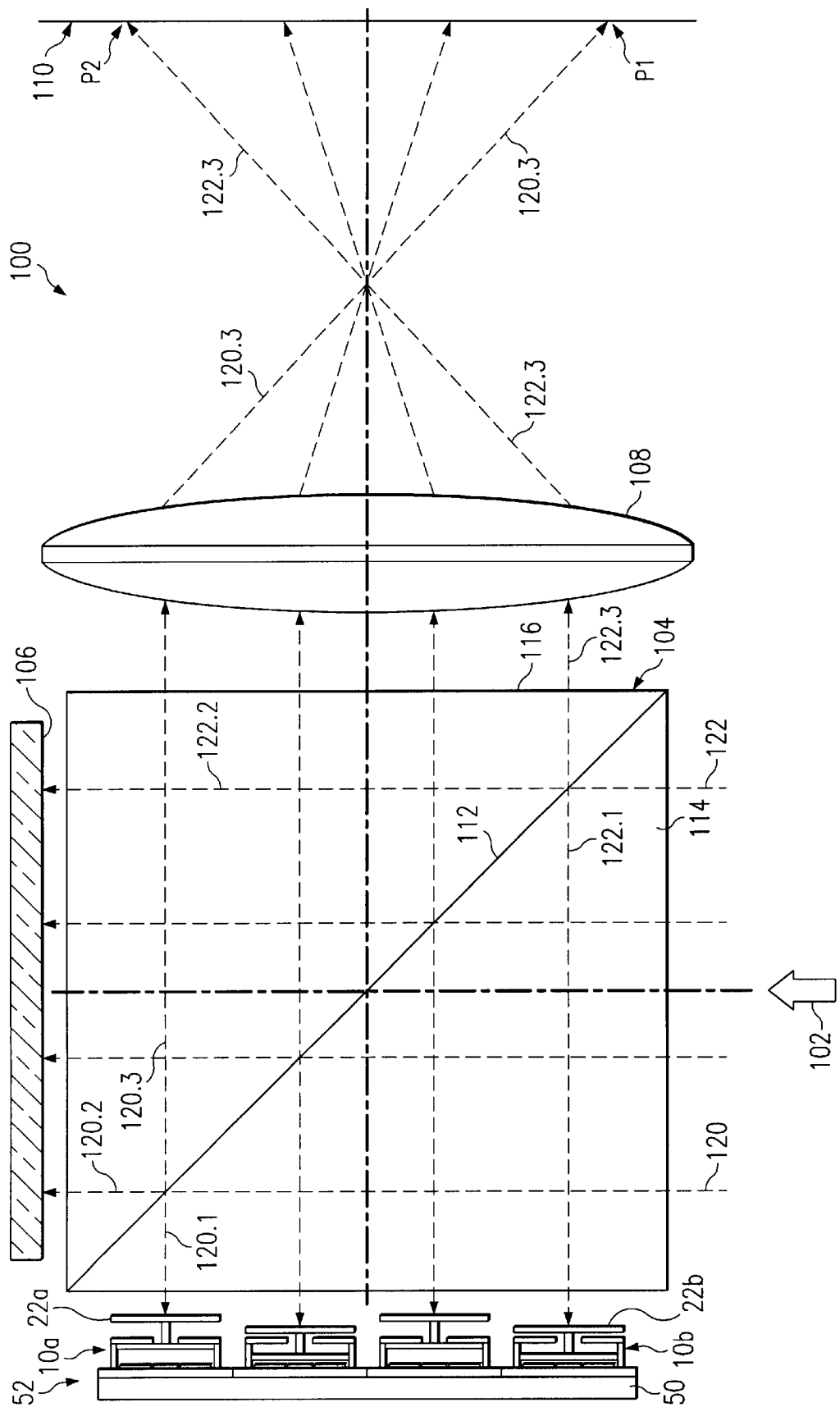

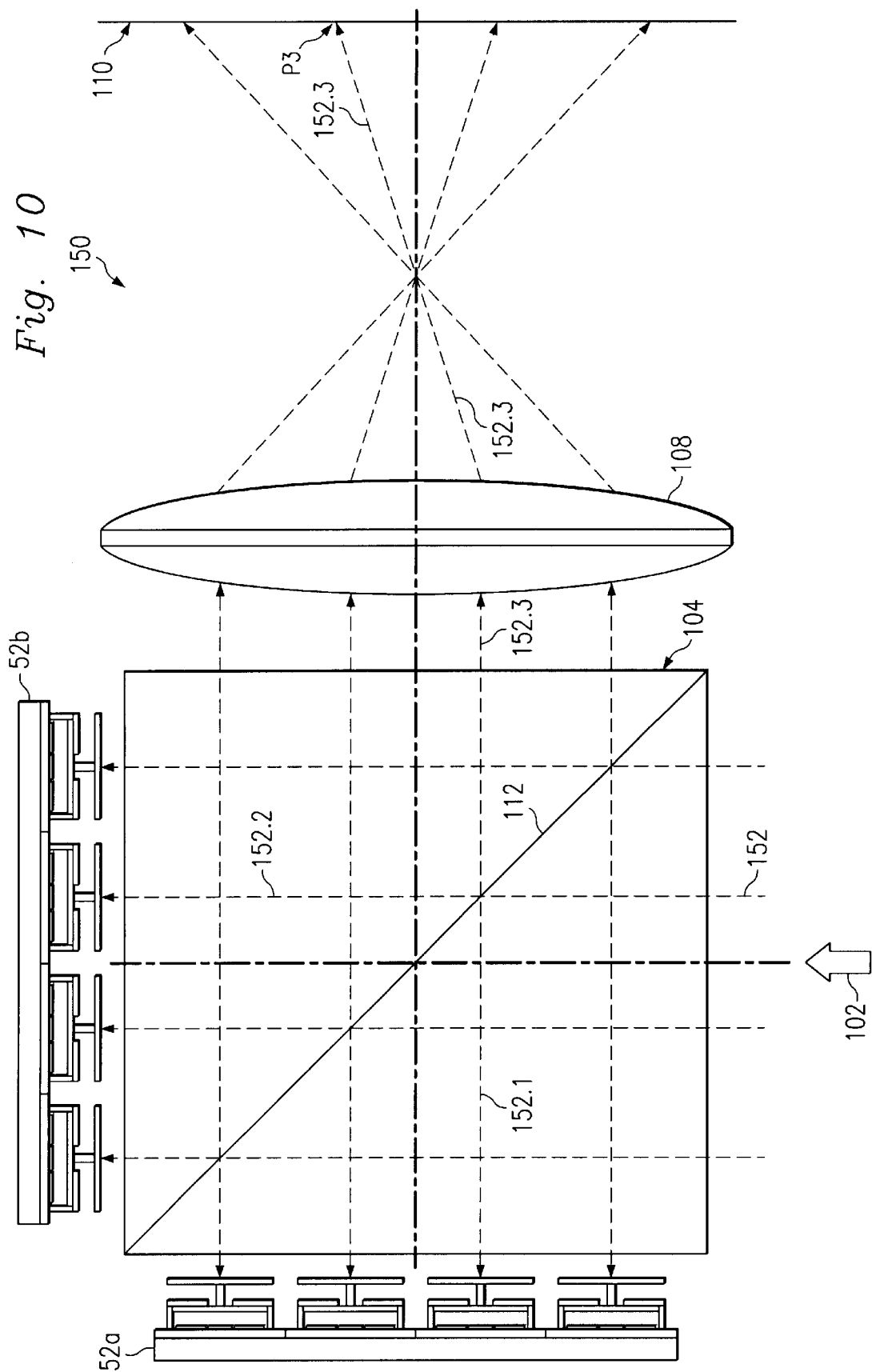

LIGHT MODULATION DEVICE AND SYSTEM

BACKGROUND

The present invention relates generally to optical devices and optical systems, and more particularly to a device for modulating a light beam intensity and a projector/exposure system using such a device.

Devices which modulate an aspect of a light beam, e.g. an amplitude or phase of the light, find a number of applications. In optical modulation applications, phase modulation is often more important than amplitude modulation. Furthermore, phase modulation devices can often perform amplitude modulation, thereby providing application flexibility. It is desired to provide a light modulation device that is fast, reliable, durable, efficient, and can be used in simple as well as complex applications.

SUMMARY

A technical advance is provided by a new and unique light modulation element, device, and system. In one embodiment, the light modulation element includes three electrodes, a flexible member, and a mirror. The flexible member is connected between the three electrodes so that the first and second electrodes are on one side and the third electrode is on the opposite side of the flexible member. The mirror is attached to the flexible member so that it can move therewith. The flexible member moves responsive to an external force provided by one or more of the three electrodes so that the mirror is positioned in a predetermined position responsive to the state of the flexible member.

In another embodiment, the light modulation element includes a substrate with first and second electrodes positioned adjacent to the substrate. One or more support members are connected to the substrate for supporting a flexible member extending over and above the first and second electrodes. In one embodiment, the second electrode is near a center portion of the flexible member. The light modulation element also includes a third electrode positioned above the flexible member and a mirror connected to and extending above the flexible member. As a result, the flexible member can be moved by changing electrostatic forces applied by one or more of the electrodes, and the mirror is moved with the flexible member.

In one embodiment, the light modulation device has a substrate and an array of light modulation elements. Each light modulation element includes first and second electrodes positioned proximate to the substrate and a flexible member extending over and above the first and second electrodes. A third electrode is positioned above the flexible member, and a mirror is connected to and extends above the flexible member. The flexible member can move between a first and second state responsive to forces affected by the electrodes so that a distance of the mirror from the substrate is controlled by the state of the flexible member.

In one embodiment, the system is a projection system such as can be used for lithography. The system includes a light source for producing a light of wavelength $\lambda$, a beamsplitter having a reflective surface, a micro-mirror device, and a reflecting device. The beamsplitter receives the light from the light source and directs a first portion of the light to the micro-mirror device and a second portion of the light to the reflecting device. The micro-mirror device includes a plurality of individual mirrors manipulatable between a first and second state. In some embodiments, the micro-mirror device (when the mirrors are in the first state) and the reflective device are positioned at a common distance from the reflective surface. The micro-mirror device, beamsplitter, and reflecting device are also positioned so that the first and second portions of light will meet. A distance traveled by the first portion of light is controllable by the different states of each mirror so that when the first and second portions of light meet, an aspect (e.g., phase or amplitude) of the light can be modulated using optical interference.

BRIEF DESCRIPTION OF THE DRAWINGS

FIGS. 9–10 are cross sectional views of different embodiments of a projection system, utilizing one or more of the light modulation devices of FIGS. 4–8.

DETAILED DESCRIPTION

The present disclosure relates to optical devices and optical systems, such as can be used in a wide variety of applications. It is understood, however, that the following disclosure provides many different embodiments, or examples, for implementing different features of the invention in specific applications. These embodiments are, of course, merely examples and are not intended to limit the invention from that described in the claims.

The present disclosure is divided into four different sections. The first section describes an element for light phase modulation. The second section describes a light phase modulation device including several of the elements. The third section describes different applications for the light phase modulation device. The fourth section concludes by describing some of the many advantages of the element, device, and applications previously discussed.

Light Phase Modulation Element

Figure 1:
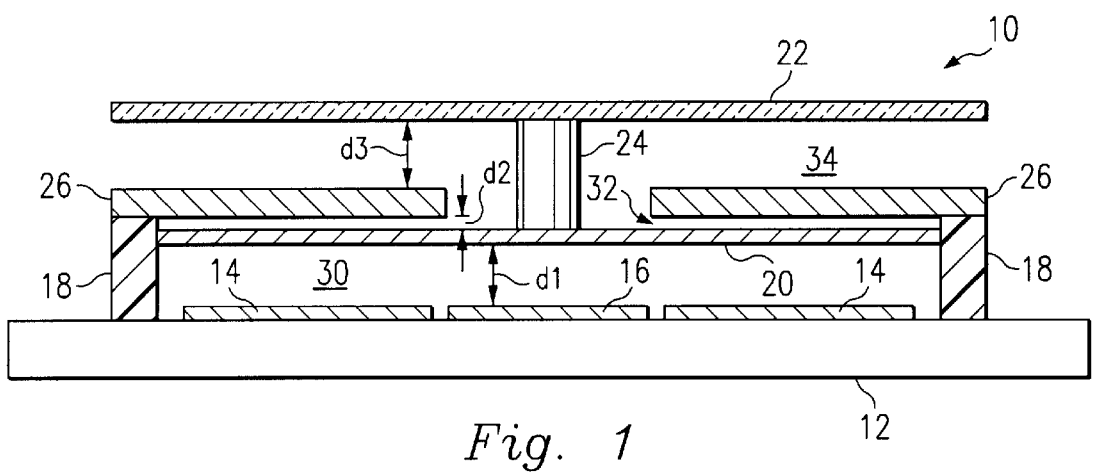
FIG. 1 is a side, cross sectional view of one embodiment of a light modulating element according to the present invention.

Referring to FIG. 1, a component layout for one embodiment of a light modulation element 10 is shown. In the present embodiment, the light modulation element 10 is constructed on a semiconductor substrate 12. Two electrodes 14, 16 are formed adjacent to the substrate 12. Each electrode is, in the present embodiment, a solid film of electrically conductive material, such as metal. The electrodes 14, 16 are positioned between two non-conductive support structures 18. The support structures 18 secure a flexible, spring-like member 20, which is also responsive to electrostatic fields. The flexible member 20 is further connected to a mirror 22 through a connecting portion 24. The mirror may be of many different types of reflective materials, such as gold, aluminum, copper, or a combination thereof, depending on the use (e.g., infrared, x-ray) for the light modulation element 10. The support structures 18 also secure a third electrode 26.

The light modulation element 10 is a micro-electromechanical (MEM) device, and therefore has several gap areas to allow mechanical movement. A first area 30 is defined between the electrodes 14, 16 and the flexible member 20. A second area 32 is defined between the flexible member 20 and the third electrode 26. A third area 34 is defined between the third electrode 26 and the mirror 22.

There are many different processing methods to construct the various gap areas 30, 32, 34. For example, a sacrificial layer can be fabricated into the areas, and then later removed by an appropriate vapor etch.

As shown in FIG. 1, a distance d1 is provided between the flexible mirror 20 and the second electrode 16; a distance d2 is provided between the flexible mirror 20 and the third electrode 26; and a distance d3 is provided between the third electrode 26 and the mirror 22. Although the distances d1, d2, d3 can vary, depending on different materials used (e.g., for the flexible member 20) or other factors, in the present embodiment, the distances are defined by equations (1) and (2), below.

$$d1, d3 \gg d2. \tag{1}$$

$$d3 \sim d1 \tag{2}$$

As will be discussed in greater detail below, in some applications, the distances d1, d2, d3 will be related to a wavelength $\lambda$ of light being reflected off of the mirror 22. For the sake of example, a light source may have a wavelength $\lambda$ of 400 nano-meters (nm). In this example, the distances d1, d3 could be equal to 100 nm and the distance d2 could be about 5–10 nm.

Figure 2:
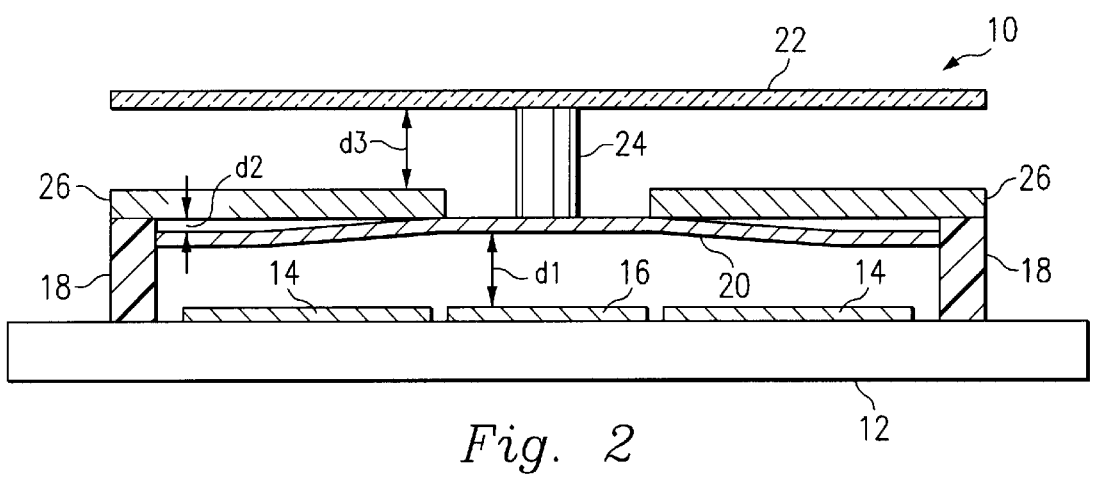
FIGS. 2 and 3 illustrate different states of the light modulating element of FIG. 1.
Figure 3:
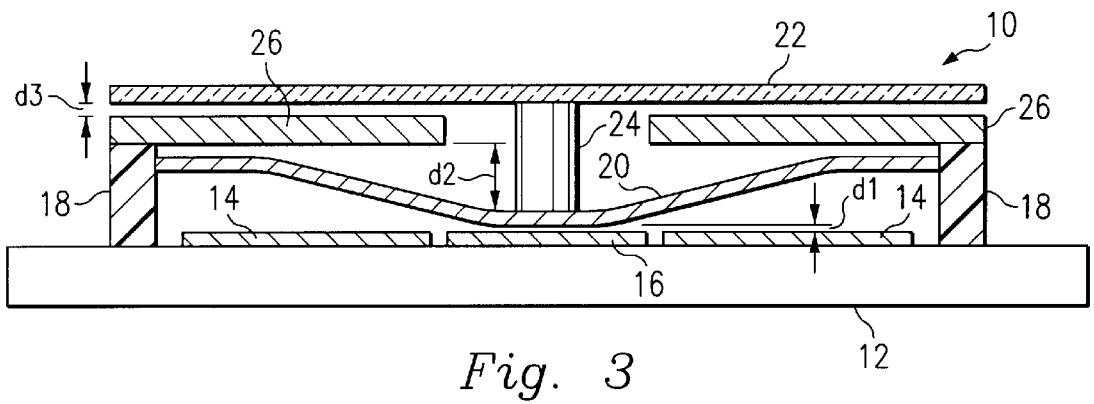

Referring also to FIGS. 2 and 3, the light modulation element 10 can be in three different mechanical states. FIG. 1 illustrates a "free" state in which the flexible member 20 is in a natural, un-flexed state. As shown in FIG. 1, the distance d2 is relatively small, and the distances d1, d3 are relatively large.

FIG. 2 illustrates an "upper" state in which the flexible member 20 is flexed upward, as seen in the figure, and away from the substrate 12. As shown in FIG. 2, the distance d2 is approximately equal to zero and the distances d1, d3 are larger than they were in the free state. In many applications, the difference between the upper and free states can be considered as insignificant.

FIG. 3 illustrates a "lower" state in which the flexible member 20 is flexed downward, as seen in the figure, and toward the substrate 12. As shown in FIG. 3, in the upper state, the distances d1, d3 are approximately equal to zero and the distance d2 is now relatively large.

The three states—free, upper, and lower—are defined by electrostatic forces applied between the three electrodes 14, 16, 26 and/or the flexible mirror 20. In the present embodiment, the flexible mirror 20 is at a first voltage and the electrodes 14, 16, 26 can selectively alternate between the first voltage and a second voltage. For the sake of reference, the first voltage will be ground, designated with a binary "0", and the second voltage will represent a positive voltage, designated with a binary "1". Furthermore, in the present example, the positive voltage 1 will electrostatically attract an item at the ground voltage 0. It is understood, however, that various combinations of different voltages can produce different operations, so that the present invention can facilitate many different design choices well understood by those of ordinary skill in the art.

The light modulation element 10 can also be in a "hold" state. The hold state maintains a prior state of the element 10, despite changes in electrode voltage. Simply put, the hold state serves as a memory for the element 10. The hold state will be discussed in greater detail, below.

The light modulation element 10 can operate in many different configurations of the electrodes 14, 16, 26. Referring now to Table 1, in one configuration, each of the electrodes 14, 16, 26 can operate independently of the others.

TABLE 1

| Electrode 14 | Electrode 16 | Electrode 26 | State |
|---|---|---|---|
| 0 | 0 | 0 | free |
| 0 | 0 | 1 | upper |
| 0 | 1 | 0 | lower |
| 0 | 1 | 1 | hold |
| 1 | 0 | 0 | lower |
| 1 | 0 | 1 | hold |
| 1 | 1 | 0 | lower |
| 1 | 1 | 1 | hold |

Referring to FIGS. 1–3, consider for example that electrodes 14 and 16 are 1 and that the light modulation element 10 is currently in the lower state, meaning that the distance d3 is small, and the mirror 22 is in the lower position. Next, electrode 26 switches to 1. According to Table 1, the light modulation element 10 will be in the hold state. In the present example, the hold state will "hold" the previous state, so that the mirror 22 stays in the lower state. Next, electrode 26 switches to 0. According to Table 1, the light modulation element 10 will still be in the hold state. This means that the previous lower state continues to be held. Therefore, as long as the electrodes 14 and 26 stay at 1, the lower state will be held. Many different scenarios can be shown to hold the free state or the upper state.

The light modulation element 10 is able to hold a certain state by controlling the strength of the electrostatic fields produced from the electrodes 14, 16 and/or 26. In the present embodiment, the strength of the electrostatic fields that are affecting the flexible member 20 are manipulated by the distances d1, d2, and/or d3. In other embodiments, the strength of the fields can be manipulated in many different ways. For example, the strength of the corresponding electrostatic fields can be manipulated by the size of the electrodes 14, 16, and/or 26, the material used to construct each electrode, the voltage applied to each electrode, and/or any intervening structures.

Referring now to Table 2, electrode 16 can also be used as an edge-trigger input. For example, if electrode 14 is 0 and electrodes 16 and 26 are 1, the light modulation element 10 will be in the hold state. However, if electrode 16 switches to 0, the light modulation element 10 will switch to the upper state. If electrode 16 switches back to 1, the light modulation element 10 will be held in the upper state. Therefore, after every change of electrode 16, the light modulation element will be in the upper state. This works in a similar manner for the lower state and the hold state.

TABLE 2

| Electrode 14 | Electrode 16 | Electrode 26 | State |
|---|---|---|---|
| 0 | Change | 1 | upper |
| 1 | Change | 0 | lower |
| 1 | Change | 1 | hold |
| 0 | 1 | 0 | lower |
| 0 | 0 | 0 | free |

Referring now to Table 3, in another configuration, electrodes 14 and 26 are tied together, and electrode 16 can operate independently of the other two. As can be seen by the last two rows of Table 3, when electrodes 14 and 26 both have the 1 voltage, the light modulation element 10 is in the hold state, regardless of the voltage for electrode 16. Therefore, the electrodes 14, 26 are treated together as a "hold electrode", placing the light modulation element 10 in and out of the hold state. When the light modulation element is not in the hold state, the electrode 16 acts as a "data electrode", with the free state corresponding to a 0 value and the lower state corresponding to a 1 value.

TABLE 3

| Electrodes 14, 26 | Electrode 16 | State |
|---|---|---|
| 0 | 0 | free |
| 0 | 1 | lower |
| 1 | 0 | hold |
| 1 | 1 | hold |

Therefore, the light modulation element 10 can perform in many different ways, and can be combined to accommodate different applications, some of which are discussed below. It is understood that there may also be different positions and/or sizes for the electrodes 14, 16, 26. In another embodiment, the third electrode 26 may be positioned between and coplanar with the first and second electrodes. In this embodiment, the first and third electrodes can be used separately—one to trigger the hold state discussed above and the other to trigger an activate function to allow the element to be responsive to the data electrode.

Light Phase Modulation Device

Figure 4:
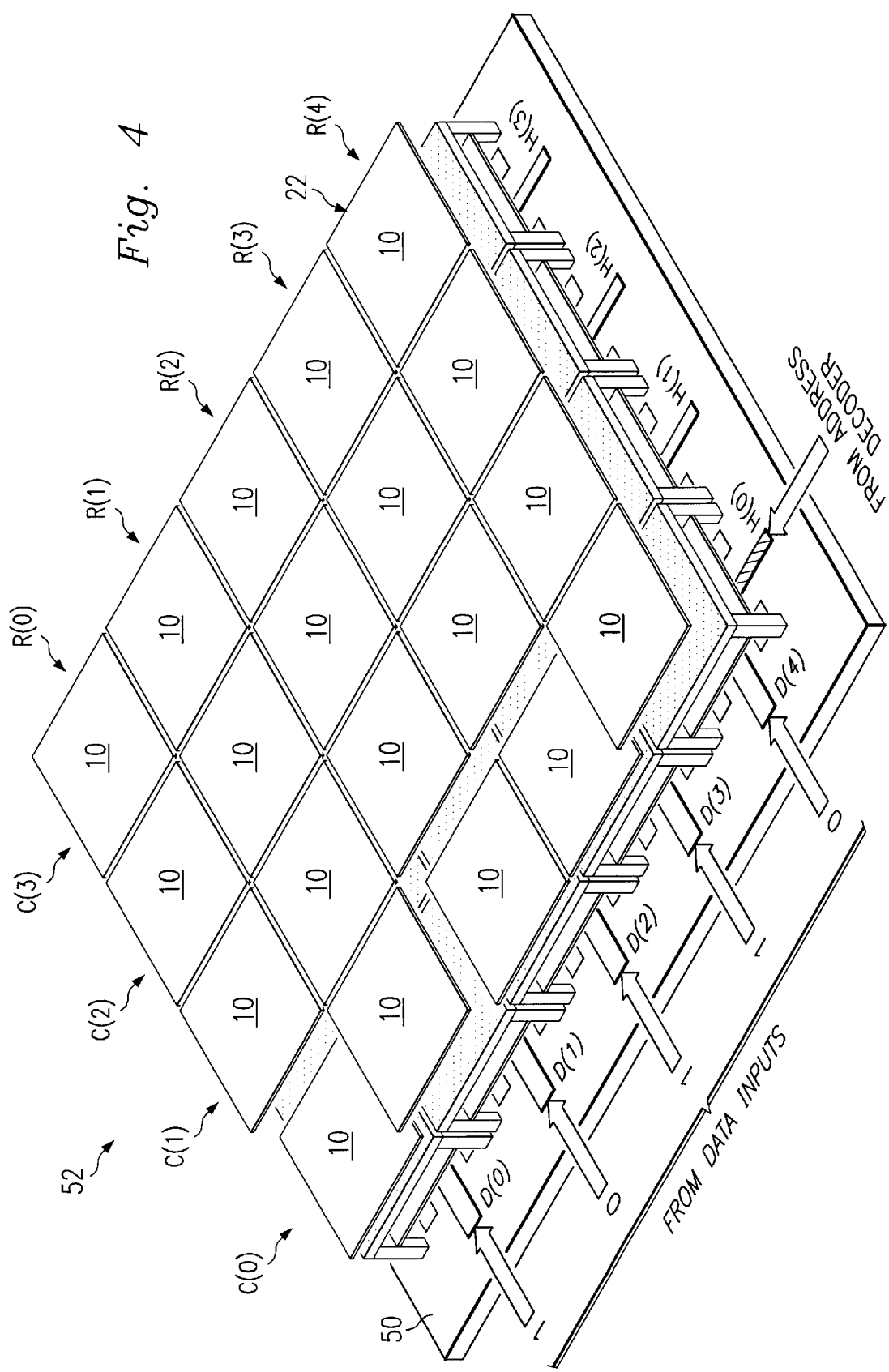
FIGS. 4–8 are isometric views of one embodiment of several light modulation elements of FIG. 1 that are part of a single micro-mirror light modulating device, according to the present invention.

Referring now to FIG. 4, a plurality of light modulation elements 10 can be configured into an array on a single monolithic substrate 50 to produce a micro-mirror light modulation device 52. In the present embodiment, there are 20 light modulation elements arranged in an array of five rows R(0), R(1), R(2), R(3), R(4), and four columns C(0), C(1), C(2), C(3). It is understood, however, that in different embodiments, there may be more or less light modulation elements in an array. Conventional SRAM, DRAM, and DMD data and addressing schemes can be utilized to implement these larger arrays, as would be evident to those of ordinary skill in the art. For example, separate column and row address may be multiplexed, as is used in many DRAM architectures. Also, a clock or latch signal can be utilized to synchronize operation.

In the present example, the light modulation elements 10 of the light modulation device 52 are configured as discussed in Table 3, above. Specifically, the first and third electrodes 14, 26 for each light modulation element 10 are electrically connected to form a hold electrode. In addition, all of the data electrodes 16 for light modulation elements on a common row are electrically connected. The data electrodes for rows R(0)–R(4) are connected to data lines D(0)–D(4), respectively. The data lines D(0..4) are further connected to data inputs of the device 52, with any intermediate circuitry (e.g., registers or buffers) as necessary. Likewise, all of the hold electrodes 14, 26 for light modulation elements on a common column are electrically connected. The hold electrodes for columns C(0)–C(3) are connected to hold lines H(0)–H(3), respectively. The hold lines H(0..3) are further connected to an address decoder of the device 52, which may be further connected to address inputs and additional circuitry, as necessary.

FIGS. 4–8 illustrate a sequence of operations for individually manipulating each light modulation element 10 of the light modulation device 52. In FIG. 4, the hold line H(0) is not asserted (set equal to 0, in the present embodiment) and a data value of:

D(0..4)=10110 is provided to the device 52. The hold line H(0) is then asserted (set equal to 1). As a result, the state for the light modulation elements 10 of column C(0) are as in Table 4, below. The voltage levels of the remaining hold lines H(1..3) are a "don't care" in the present example, and may be of different values according to different implementations.

TABLE 4

| Row | Column | State |
|---|---|---|
| R(0) | C(0) | lower |
| R(1) | C(0) | free |
| R(2) | C(0) | lower |
| R(3) | C(0) | lower |
| R(4) | C(0) | free |
| R(0..4) | C(1..3) | don't care |

Figure 5:
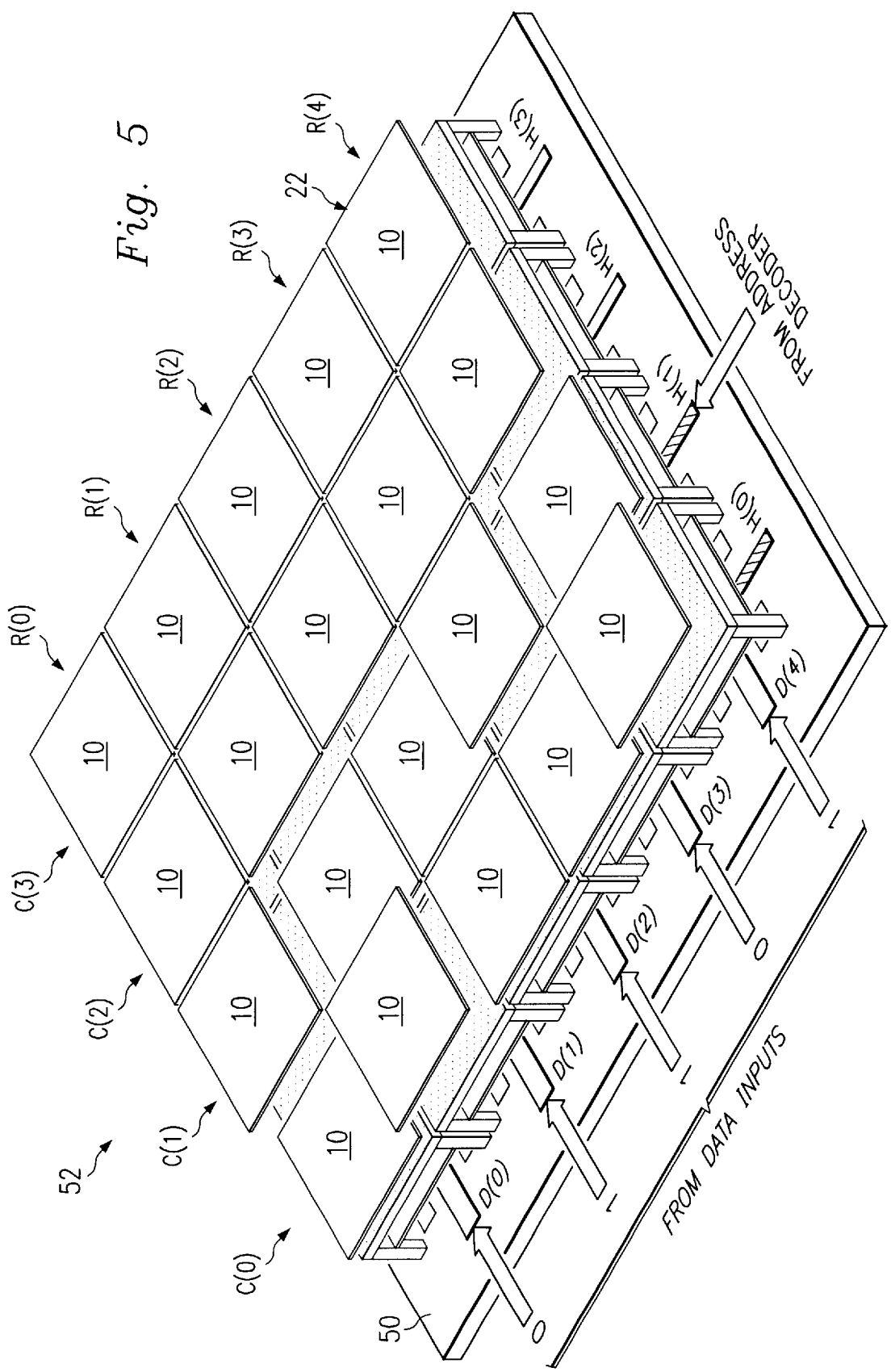

Next, in FIG. 5, the hold line H(1) is not asserted (the hold line H(0) remains asserted) and a data value of:

D(0..4)=01101 is provided to the device 52. The hold line H(1) is then asserted (the hold line H(0) remains asserted). As a result, the state for the light modulation elements 10 of column C(0..1) are as in Table 5, below.

TABLE 5

| Row | Column | State |
|---|---|---|
| R(0) | C(0) | lower |
| R(1) | C(0) | free |
| R(2) | C(0) | lower |
| R(3) | C(0) | lower |
| R(4) | C(0) | free |
| R(0) | C(1) | free |
| R(1) | C(1) | lower |
| R(2) | C(1) | lower |
| R(3) | C(1) | free |
| R(4) | C(1) | lower |
| R(0..4) | C(2..3) | don't care |

Figure 6:
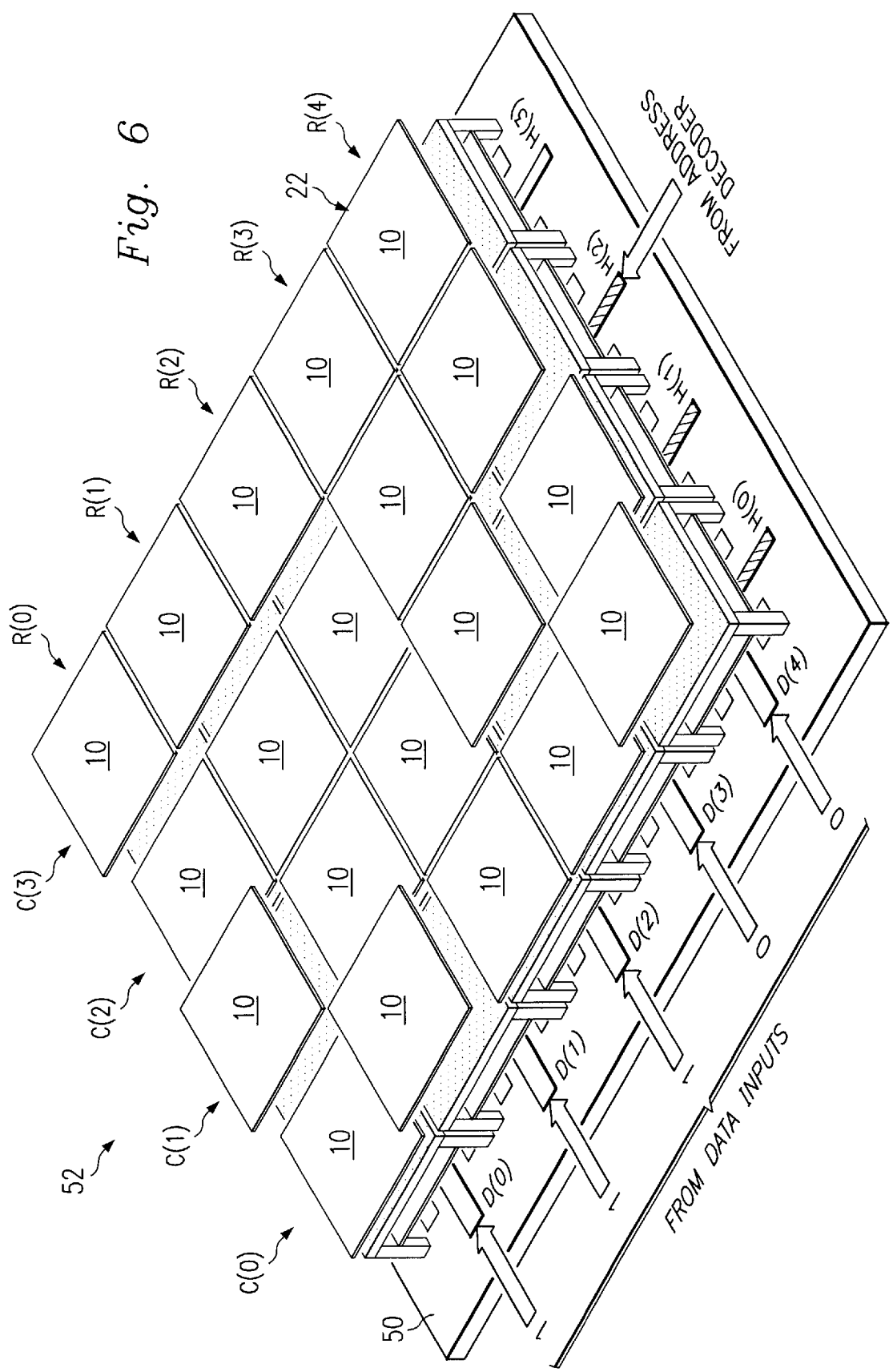

Next, in FIG. 6, the hold line H(2) is not asserted (the hold lines H(0..1) remain asserted) and a data value of:

D(0..4)=11100 is provided to the device 52. The hold line H(2) is then asserted (the hold lines H(0..1) remain asserted). As a result, the state for the light modulation elements 10 of column C(0..2) are as in Table 6, below.

TABLE 6

| Row | Column | State |
|---|---|---|
| R(0) | C(0) | lower |
| R(1) | C(0) | free |
| R(2) | C(0) | lower |
| R(3) | C(0) | lower |
| R(4) | C(0) | free |
| R(0) | C(1) | free |
| R(1) | C(1) | lower |
| R(2) | C(1) | lower |
| R(3) | C(1) | free |
| R(4) | C(1) | lower |
| R(0) | C(2) | lower |
| R(1) | C(2) | lower |
| R(2) | C(2) | lower |
| R(3) | C(2) | free |
| R(4) | C(2) | free |
| R(0..4) | C(3) | don't care |

Figure 7:
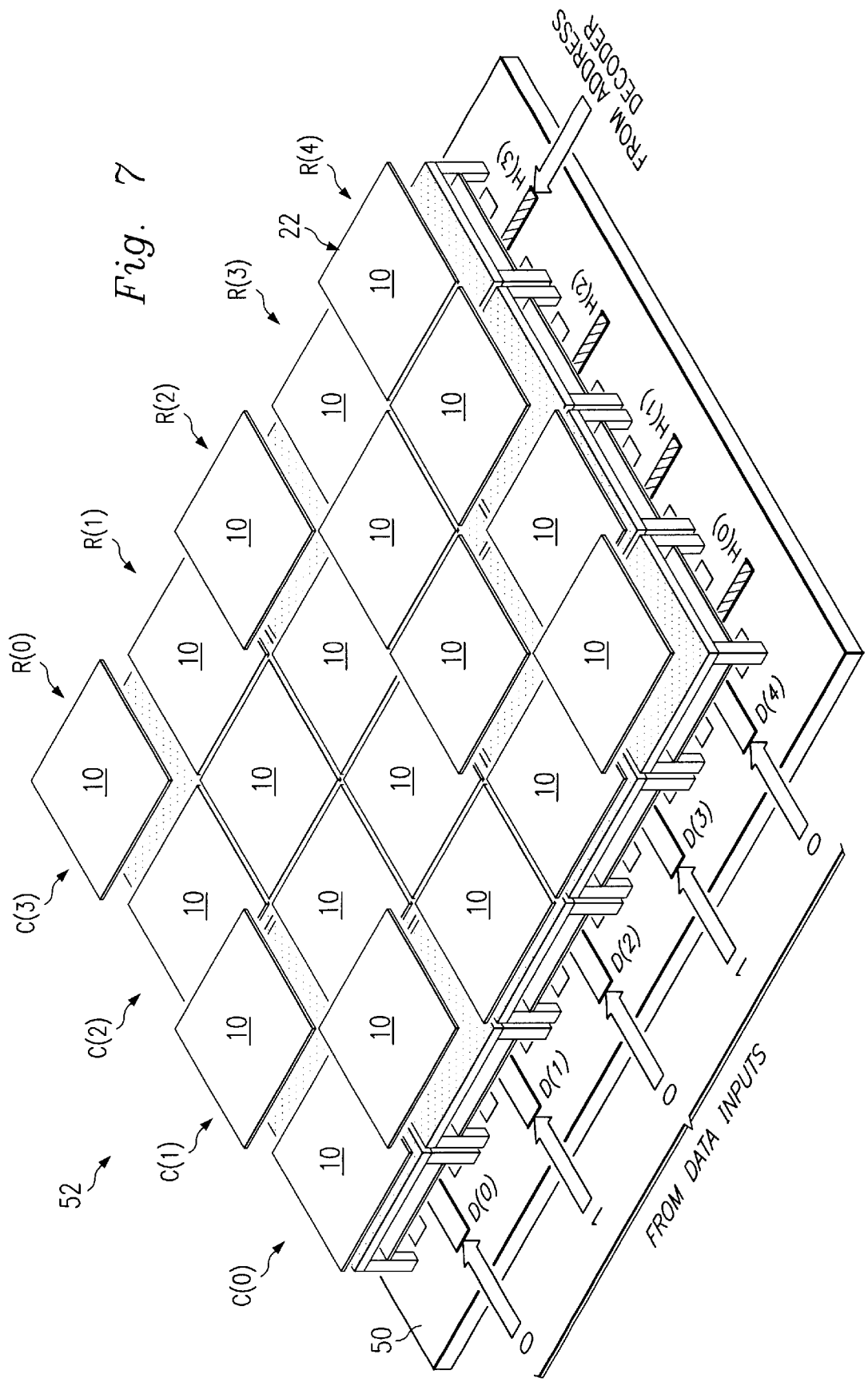

Next, in FIG. 7, the hold line H(3) is not asserted (the hold lines H(0..2) remain asserted) and a data value of:

D(0..4)=01010 is provided to the device 52. The hold line H(3) is then asserted (the hold lines H(0..2) remain asserted). As a result, the state for all the light modulation elements 10 of device 52 is provided in Table 7, below.

TABLE 7

| Row | Column | State |
|---|---|---|
| R(0) | C(0) | lower |
| R(1) | C(0) | free |
| R(2) | C(0) | lower |
| R(3) | C(0) | lower |
| R(4) | C(0) | free |
| R(0) | C(1) | free |
| R(1) | C(1) | lower |
| R(2) | C(1) | lower |
| R(3) | C(1) | free |
| R(4) | C(1) | lower |
| R(0) | C(2) | lower |
| R(1) | C(2) | lower |
| R(2) | C(2) | lower |
| R(3) | C(2) | free |
| R(4) | C(2) | free |
| R(0) | C(2) | free |
| R(1) | C(2) | lower |
| R(2) | C(2) | free |
| R(3) | C(2) | lower |
| R(4) | C(2) | free |

Figure 8:
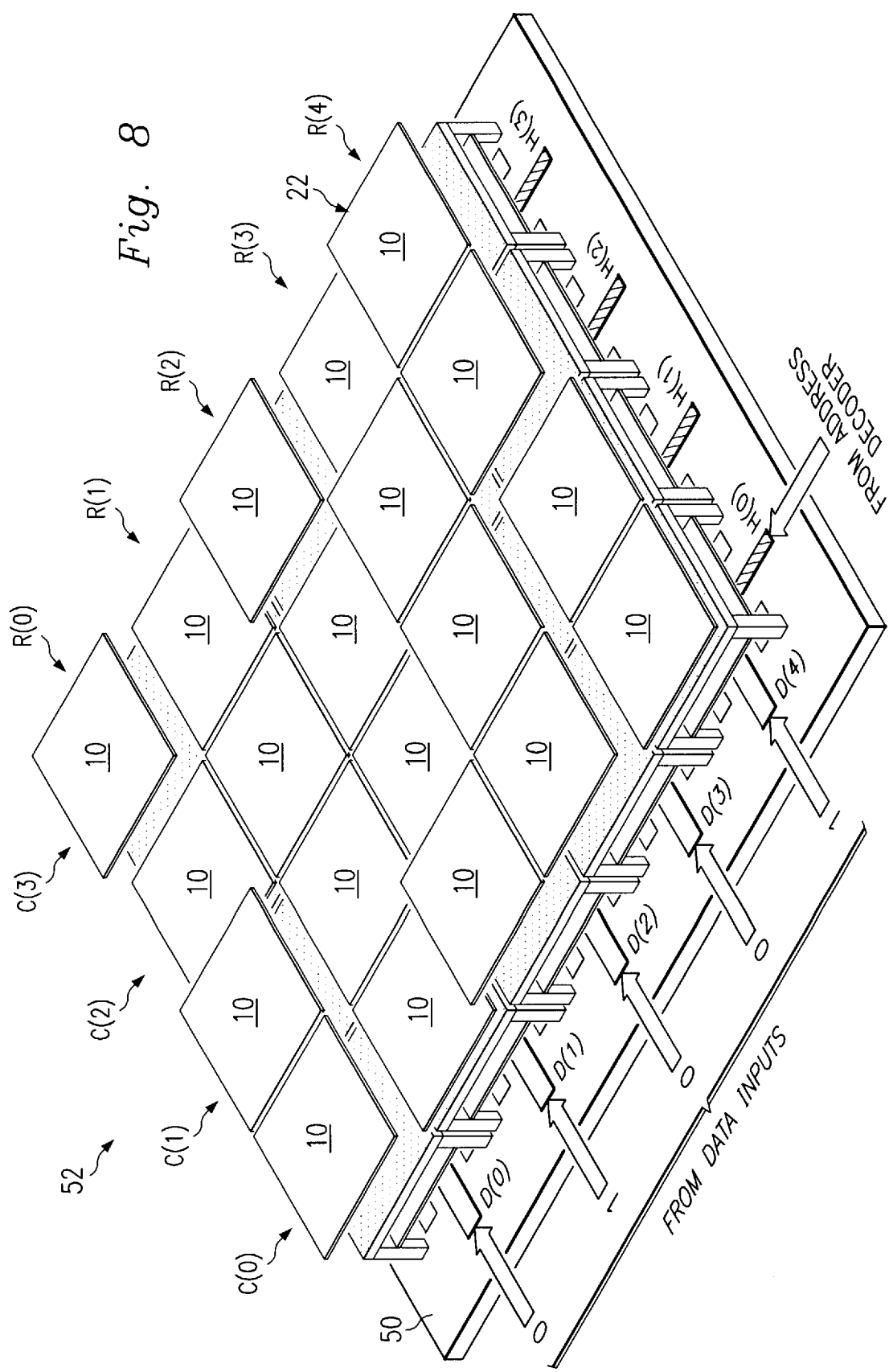

Next, in FIG. 8, the hold line H(0) is not asserted (the hold lines H(1..3) remain asserted) and a data value of:

D(0..4)=01001 is provided to the device 52. The hold line H(0) is then asserted (the hold lines H(1..3) remain asserted). As a result, the state for all the light modulation elements 10 of device 52 is provided in Table 8, below.

TABLE 8

| Row | Column | State |
|---|---|---|
| R(0) | C(0) | free |
| R(1) | C(0) | lower |
| R(2) | C(0) | free |
| R(3) | C(0) | free |
| R(4) | C(0) | lower |
| R(0) | C(1) | free |
| R(1) | C(1) | lower |
| R(2) | C(1) | lower |
| R(3) | C(1) | free |
| R(4) | C(1) | lower |
| R(0) | C(2) | lower |
| R(1) | C(2) | lower |
| R(2) | C(2) | lower |
| R(3) | C(2) | free |
| R(4) | C(2) | free |
| R(0) | C(2) | free |
| R(1) | C(2) | lower |
| R(2) | C(2) | free |
| R(3) | C(2) | lower |
| R(4) | C(2) | free |

Therefore, the light modulation device 52 can easily address and store data in each element 10 without the use of any additional memory. Also, it is understood that different light modulation devices can be constructed, such as those that utilize the operation of the light element 10 discussed in Tables 1 and 2, above.

Light Phase Modulation Applications

Referring now to FIG. 9, the light modulation device 52 can be used as part of a projector system 100. The projector system 100 also includes a light source 102, a beam-splitter 104, a mirror 106, and a lens system 108 for projecting an image onto a surface 110. The image from the projector system 100 is defined by a plurality of pixels, corresponding to the number of light modulation elements 10 on the light modulation device 52 (or multiples thereof).

The light source 102 may produce either coherent or non-coherent light. Certain applications can benefit by using a cheaper non-coherent light source. In the present example, the light source 102 produces light of a wavelength $\lambda$. Furthermore, each mirror 22 of the device 52 can move a distance of $\lambda/4$ between the free state and the lower state. The lens system 108 is illustrated as a single lens, but it is understood that various combinations may be employed, to meet various design choices.

The beamsplitter 104 includes a reflective surface 112 positioned between two transparent prisms 114, 116. In the present embodiment, the reflective surface 112 is a 50/50 splitter, in that half of the light intensity is allowed to pass directly through the reflective surface, while the other half reflects off the reflective surface. In some embodiments, the reflective surface may be a dichroic mirror, having different reflecting and/or passing characteristics responsive to the wavelength of incident light. Also in the present embodiment, the mirror 106 can reflect 100% of incident light. It is understood, however, that different applications may utilize different mirrors, beamsplitters, or other similar items.

In one embodiment, the beamsplitter 104 is also positioned, with the light modulation device 52 and the mirror 106, so that a perpendicular distance from the mirror 106 to a point on the reflective surface 112 is equal to a perpendicular distance from a mirror 22 (in the free state) of a corresponding light modulation element 10 to the same point. This perpendicular distance is determined when the corresponding light modulation element is in the free state. It is understood, that in other embodiments, the perpendicular distance may be determined when the light modulation element is in a different state. In these other embodiments, the logic discussed below will need to be altered, accordingly. It is further understood that in additional embodiments (e.g., laser applications), the distances for the mirror 22 and the mirror 106 to the reflective surface may be different.

To describe the operation of the projecting system 100, several light beams from the light source 102 can be traced. Consider a beam 120 being projected towards the beam splitter 104. When the beam 120 reaches the reflective surface 112, two separate beams 120.1, 120.2 (each 50% the intensity of beam 120) are produced. The beam 120.1 reflects off of the reflective surface 112 and onto the mirror 22a of light modulation element 10a. In this example, the light modulation element 10a is in the free state. The beam 120.1 then reflects back towards the reflective surface 112. Simultaneously, the beam 120.2 passes through the reflective surface and onto the mirror 106. The beam 120.2 then reflects back towards the reflective surface 112.

In the present example, the overall distance that beam 120.1 travels is exactly equal to the overall distance that beam 120.2 travels. Therefore, when the beams 120.1, 120.2 meet again at the reflective surface 112, they constructively add to produce an output beam 120.3 with a significant amplitude (referred to as "ON") and directly in phase with the light beam 120.1. The light beam 120.3 then passes through the lens system 108 and projects a pixel onto a point P1 of the surface 110.

Consider now a beam 122 being projected towards the beam splitter 104. When the beam 122 reaches the reflective surface 112, two separate beams 122.1, 122.2 (each 50% the intensity of beam 122) are produced. The beam 122.1 reflects off of the reflective surface 112 and onto the mirror 22b of light modulation element 10b. In this example, the light modulation element 10a is in the lower state. The beam 122.1 then reflects back towards the reflective surface 112. Simultaneously, the beam 122.2 passes through the reflective surface and onto the mirror 106. The beam 122.2 then reflects back towards the reflective surface 112.

In the present example, the overall distance that beam 122.1 travels is exactly half a wavelength ($\lambda/4+\lambda/4$) more than the overall distance that beam 122.2 travels. Therefore, when the beams 122.1, 122.2 meet again at the reflective surface 112, they interfere destructively to produce an output beam 122.3 with almost no amplitude (referred to as "OFF"). Accordingly, no pixel is projected at a point P2 identified by the output beam 122.3.

Referring now to FIG. 10, two light modulation devices 52a, 52b can be used as part of another projector system 150. The projector system 150 is similar to the projector system 100 of FIG. 9, with identical components number consistently. It is noted, however, that the projector system 150 includes the second light modulation device 52b where the mirror 106 of the previous system 100 was located.

The projector system 150 includes the additional ability to selectively alter the phase of the light from the light source 102. To provide a further example, the beamsplitter 104 is now positioned with the light modulation devices 52a, 52b, so that a perpendicular distance from a point on the reflective surface 112 to corresponding light modulation elements of the light modulation devices is a multiple of $\lambda/2$, when that light modulation element is in the lower state (this example is opposite to the one of FIG. 9).

Consider now a beam 152 being projected towards the beam splitter 104. When the beam 152 reaches the reflective surface 112, two separate beams 152.1, 152.2 (each 50% the intensity of beam 152) are produced. The beam 152.1 reflects off of the reflective surface 112 and onto the mirror 22c of light modulation element 10c (of light modulation device 52a). The beam 152.1 then reflects back towards the reflective surface 112. Simultaneously, the beam 152.2 passes through the reflective surface and onto the mirror 22d of light modulation element 10d (of light modulation device 52b). The beam 152.2 then reflects back towards the reflective surface 112.

In the present example, the light modulation elements 10c, 10d are in the same state. Therefore, the overall distance that the beam 152.1 travels is exactly the same as the overall distance that beam 152.2 travels. The beams 152.1, 152.2 then meet again at the reflective surface 112, where they constructively add to produce an output beam 152.3 that is ON. The light beam 152.3 then passes through the lens system 108 and projects a pixel onto a point P3 of the surface 110.

However, this distance traveled by the beams 152.1 and 152.2 is different for different states of the light modulation elements 10c, 10d. If both elements 10c, 10d are in the free state, both beams 152.1, 152.2 have traveled a half wavelength ($\lambda/4+\lambda/4$) less than if both light modulation elements are in the lower state. Therefore, when the beams 152.1, 152.2 meet again at the reflective surface 112, they may be exactly in phase with the incident beam 152.1, or may be 180° out of phase with the beam.

CONCLUSION

The elements, devices, and applications discussed above provide many advantages. For one, the light efficiency is very high (close to 100%). Also, there are no scanning components, although the systems 100, 150 can be used, for example, in a scanning lithography system.

Another advantage is that the elements, devices, and applications above can support different wavelengths from the light source 102 with slight modification. For example, the movement distance for each mirror 22 of a light modulation element 10 can be adjusted by changing the voltages on the electrodes 14, 16, 26. Also, the applications can use either coherent or non-coherent light (time/temporal coherent or spatial coherent).

Another advantage is that the light modulation device 52 does not require a separate memory. This can improve reliability (e.g., memory cells can be adversely affected by light) and can reduce manufacturing cost.

Yet another advantage is that the applications above work well for high light intensity applications as well as short wavelength applications, such as is discussed in U.S. Pat. No. 5,986,795, which is hereby incorporated by reference. For example, the light modulation device 52 works for soft x-ray applications as well as extreme ultra-violet (or "EUV") lithography with wavelengths of 100 nm or less. In these applications, the mirror 22 may be constructed with a multilayer reflective coating, including but not limited to alternate coatings of molybdenum and silicon, such as is discussed in U.S. Pat. No. 6,110,607, which is hereby incorporated by reference.

While the invention has been particularly shown and described with reference to the preferred embodiment thereof, it will be understood by those skilled in the art that various changes in form and detail may be made therein without departing form the spirit and scope of the invention. For example, instead of electrostatic force, different types of force may be used, including mechanical forces induced by a piezoelectric or pyroelectric actuator.

What is claimed is:

1. A light modulation element comprising:
   a first, second, and third electrode;
   a flexible member connected between the three electrodes so that the first and second electrodes are on one side of the flexible member and the third electrode is on the opposite side of the flexible member, wherein the flexible member is responsive to an external force provided by one or more of the three electrodes;
   a mirror attached to the flexible member; and
   a first gap between the flexible member and the first and second electrodes so that a portion the flexible member can move vertically between a first and second state;
   wherein the mirror is vertically positioned in a predetermined position responsive to the state of the flexible member.

2. The element of claim 1 further comprising:
   a second gap between the flexible member and the third electrode so that the flexible member can also move to a third state.

3. The element of claim 1 wherein the electrodes and flexible member are positioned so that when the flexible member is in the first state, the flexible member is more responsive to the third electrode than to the first or second electrode, thereby allowing the third electrode to hold the flexible member in the first state.

4. The element of claim 1 wherein the first state represents a natural, un-flexed state for the flexible member, and wherein the electrodes and flexible member are positioned so that when the flexible member is in the first state, the third electrode is closer to the flexible member than either the first or second electrodes.

5. The element of claim 1 wherein the third electrode is larger than the second electrode.

6. The element of claim 1 wherein, when the flexible member is in the first state, the third electrode can provide a stronger external force on the flexible mirror than either the first or second electrodes.

7. The element of claim 1 wherein, when the flexible member is in the second state, it is more responsive to the second electrode than the third electrode.

8. The element of claim 1 wherein, when the flexible member is in the second state, the second electrode is closer to the flexible member than the third electrode.

9. The element of claim 1 wherein, when the flexible member is in the second state, the second electrode can provide a stronger external force on the flexible mirror than the first electrode.

10. A light modulation element comprising:
   a substrate;
   first and second electrodes positioned adjacent to the substrate;
   first and second support members connected to the substrate;
   a flexible member spanning between the first and second support members and extending over and above the first and second electrodes, such that the second electrode is near a center portion of the flexible member;
   a third electrode positioned above the flexible member; and
   a mirror connected to and extending above the flexible member, the mirror operable to be perpendicularly displaced relative to the substrate when the flexible member is displaced.

11. The element of claim 10 further comprising:
   a gap between the second and third electrodes in which the flexible member can move.

12. The element of claim 10 wherein all three electrodes include a material capable of affecting an electrostatic force and the flexible member is made of a material that is responsive to the electrostatic force.

13. The element of claim 12 wherein the first and third electrodes are electrically tied together.

14. The element of claim 13 wherein the first, second, and third electrodes are positioned so that when the first and third electrodes are affecting an electrostatic force, the flexible member is not responsive to an electrostatic force affected by the second electrode.

15. The element of claim 13 wherein the first and third electrodes are capable of producing an electrostatic force that is greater in magnitude than an electrostatic force produced by the second electrode.

16. The element of claim 13 wherein the first and third electrodes are larger than the second electrode.

17. The element of claim 13 wherein, when no electrostatic force is being affected by any electrode, the flexible member is in a free state, and wherein, when an electrostatic force is affected by the second electrode, the flexible member is in a lower state.

18. The element of claim 17 wherein, when the flexible member is in the free state, it is closer to the third electrode than either the first or second electrodes.

19. A light modulation element comprising:
   a substrate;
   first, second, and third electrodes connected to the substrate;
   a flexible member;
   means connected to the substrate for supporting the flexible member to extend over and above the three electrodes, so that a gap is formed between the flexible member and the three electrodes thereby allowing the flexible member to move between a first and second state;
   a mirror extending above the flexible member; and
   means for connecting the mirror to the flexible member so that the mirror stays parallel with the substrate and a distance between the substrate and the mirror is controlled by the state of the flexible member;
   wherein the first and second electrodes are situated to hold the flexible member in a prior state responsive to a hold voltage applied thereto, and
   wherein the third electrode is situated to selectively move the flexible member between the first and second states responsive to a data voltage applied thereto.

20. The element of claim 19 wherein, when the three electrodes are situated by being sized to produce an electrostatic force of a predetermined quantity.

21. A device comprising a substrate and an array of light modulation elements, each light modulation element comprising:
   first and second electrodes positioned proximate to the substrate;
   a flexible member extending over and above the first and second electrodes, such that the flexible member can move between a first and second state;
   a third electrode positioned above the flexible member; and
   a mirror connected to and extending above the flexible member such that a vertical distance of the mirror from the substrate is controlled by the state of the flexible member.

22. The device of claim 21 wherein each light modulation element further comprises:
   a gap between the three electrodes in which the flexible member can move.

23. The device of claim 21 wherein all three electrodes of each element include a material capable of affecting an electrostatic force and the flexible member of each element is made of a material that is responsive to the electrostatic force.

24. The device of claim 21 wherein the elements are arranged in rows and columns, and wherein the second electrode of each element in a common row is electrically connected to produce a data line for the elements in that row, and wherein the first and third electrodes of each element in a common column are electrically connected to produce a hold line for the elements in that column.

25. The device of claim 21 wherein the first, second, and third electrodes of each element are situated so that, when an electrostatic force is being affected by the first and third electrodes of any particular column, a state of the flexible member is held, regardless of any electrostatic force being affected by the second electrode of any element in that column.

26. A projection system comprising:
   a light source for producing a light of wavelength $\lambda$;
   a beamsplitter having a reflective surface for receiving the light and directing a first portion of the light to a micro-mirror device and a second portion of the light to a reflecting device;
   the micro-mirror device comprising a plurality of individual mirrors manipulatable between a first and second state, wherein the micro-mirror device is positioned a distance (d) between a point on the reflective surface and a mirror of the micro-mirror device, when in the first state; and the reflecting device positioned the distance (d) between the point on the reflecting device and the reflective surface;

wherein the micro-mirror device, beamsplitter, and reflecting device are positioned so that the first and second portions of light will meet after reflecting off the micro-mirror device and reflecting device, respectively; and wherein the states of the micro-mirror device are for controlling a distance traveled by the first portion of light so that when the first and second portions of light meet, an aspect of the light can be selectively modulated.

27. The projection system of claim 26 wherein the first and second states of the individual mirrors of the micro-mirror device are separated by a distance of one-fourth fourth $\lambda$.

28. The projection system of claim 26 wherein the micro-mirror device includes at least one electrode, such that the distance between the first and second states of the individual mirrors is controlled by a voltage level on the at least one electrode.

29. The projection system of claim 26 wherein the micro-mirror device further comprises a plurality of elements associated with each mirror, each element comprising:

first and second electrodes;

a flexible member extending over and above the first and second electrodes, such that the flexible member can move between a first and second state;

a third electrode positioned above the flexible member; and means for connecting the corresponding mirror to the flexible member.

30. The projection system of claim 28 wherein each element further comprises:

a gap between the three electrodes in which the flexible member can move.

31. The projection system of claim 28 wherein all three electrodes of each element include a material capable of affecting an electrostatic force and the flexible member of each element is made of a material that is responsive to an electrostatic force.

32. The projection system of claim 28 wherein the elements are arranged in rows and columns, and wherein the second electrode of each element in a common row is electrically connected, and wherein the first and third electrodes of each element in a common column are all electrically connected.

33. The projection system of claim 28 wherein the first, second, and third electrodes of each element are situated so that, when an electrostatic force is being affected by the first and third electrodes of any particular column, a state of the flexible member is held, regardless of any electrostatic force being affected by the second electrode of any element in that column.

34. The projection system of claim 26 wherein the reflecting device is a second micro-mirror device;

wherein a distance traveled by the second portion of light is controllable so that when the first and second portions of light meet, two different aspects of the light can be modulated.

35. A projection system comprising:

a light source for producing a light of wavelength $\lambda$;

means for reflecting the light a micro-mirror device comprises a substrate and a plurality of elements connected to the substrate, with each element comprising first, second and third electrodes, a flexible member extending over and above the first and second electrodes, and a mirror connected to the flexible member so that the mirror can move between a first and second state responsive to movement of the flexible member, the mirror being connected to the flexible member so that a plane of the mirror when in the first state is parallel to the plane of the mirror when in the second state;

a beamsplitter having a reflective surface for receiving the light and directing a first portion of the light to the micro-mirror device and a second portion to the means for reflecting light, wherein the micro-mirror device, beamsplitter, and means for reflecting light are positioned so that the first and second portions of light will meet after reflecting off the micro-mirror device and means for reflecting light, respectively.

36. The projection system of claim 35 wherein the first and second states of the individual mirrors of the micro-mirror device are separated by a distance of one-fourth fourth $\lambda$.

37. The projection system of claim 36 wherein the distance between the first and second states of the individual mirrors is controlled by a voltage level on at least one electrode.

38. The projection system of claim 35 wherein each element of the micro-mirror device further comprises:

a gap between the three electrodes and the flexible member to allow the movement of the flexible member.

39. The projection system of claim 35 wherein all three electrodes of each element include a material capable of affecting an electrostatic force and the flexible member of each element is made of a material that is responsive to an electrostatic force.

40. The projection system of claim 35 wherein the elements are arranged in rows and columns, and wherein the second electrode of each element in a common row is electrically connected, and wherein the first and third electrodes of each element in a common column are all electrically connected.

41. The projection system of claim 35 wherein the first, second, and third electrodes of each element are situated so that, when an electrostatic force is being affected by the first and third electrodes of any particular column, a state of the flexible member is held, regardless of any electrostatic force being affected by the second electrode of any element in that column.

42. The projection system of claim 35 wherein the means for reflecting light includes means for controlling a distance traveled by the second portion of light so that when the first and second portions of light meet, two different aspects of the light can be modulated.

* * * * *